(12) United States Patent
de Kleer

(10) Patent No.: US 8,073,798 B2
(45) Date of Patent: Dec. 6, 2011

(54) DYNAMIC DOMAIN ABSTRACTION THROUGH META-ANALYSIS

(75) Inventor: Johan de Kleer, Los Altos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 1010 days.

(21) Appl. No.: 11/928,444

(22) Filed: Oct. 30, 2007

(65) Prior Publication Data

US 2008/0294582 A1      Nov. 27, 2008

Related U.S. Application Data

(60) Provisional application No. 60/931,535, filed on May 24, 2007, provisional application No. 60/931,526, filed on May 24, 2007.

(51) Int. Cl.
*G06N 5/02* (2006.01)
(52) U.S. Cl. ......................................................... 706/46
(58) Field of Classification Search ...................... 706/46
See application file for complete search history.

(56) References Cited

U.S. PATENT DOCUMENTS

| | | | | |
|---|---|---|---|---|
| 5,088,048 A * | 2/1992 | Dixon et al. | ..................... | 706/51 |
| 5,428,619 A | 6/1995 | Schwartz et al. | | |
| 7,937,175 B2 * | 5/2011 | de Kleer et al. | ................. | 700/99 |
| 7,962,321 B2 * | 6/2011 | de Kleer | .......................... | 703/14 |

| | | | |
|---|---|---|---|
| 2006/0122817 A1 | 6/2006 | Baumgartner et al. | |
| 2006/0212837 A1 | 9/2006 | Prasad | |
| 2007/0005419 A1 * | 1/2007 | Horvitz et al. .................. | 705/14 |

OTHER PUBLICATIONS

U.S. Appl. No. 11/940,493, filed Nov. 15, 2007, de Kleer.
U.S. Appl. No. 11/942,234, filed Nov. 19, 2007, de Kleer.
U.S. Appl. No. 11/775,560, filed Jul. 10, 2007, de Kleer.
Addanki, et al., "Reasoning About Assumptions in Graphs of Models", In *Proc. 11th Int. Joint Conf. on Artificial Intelligence*, pp. 1432-1438, Detroit, MI, Aug. 1989.
De Kleer et al., "Diagnosing Multiple Faults", this paper is a correction (as of Mar. 22, 1992, pp. 100-117) of one which first appeared in *Artificial Intelligence*, 32(1):97-130, Apr. 1987 [also in: *Readings in NonMonotonic Reasoning*, edited by Matthew L. Ginsbert, (Morgan Kaufman, 1987), 280-297].
De Kleer et al., "Characterizing Diagnoses and Systems", pp. 54-65 [originally appeared in *Artificial Intelligence*, 56(2-3):197-222, 1992].
De Kleer, "Modeling When Connections Are the Problem", In the *Proc. 20th IJCAI*, 2007, pp. 310-317, Hyderabad, India.
Falkenhainer et al., "Compositional Modeling: Finding the Right Model for the Job", *Elsevier Science Publishers B.V., Artificial Intelligence*, 51(1:3):95-143, 1991 [also in: J. de Kleer and B. Williams (eds.) *Qualitative Reasoning about Physical Systems II* (North-Holland, Amsterdam, 1991 / MIT Press, Cambridge, Mass., 1992).].
Raiman et al., "Characterizing Non-Intermittent Faults", pp. 170-175, this paper originally appeared in *Proceedings AAAI-91*, Anaheim, CA (1991) 849-854.

(Continued)

*Primary Examiner* — Michael B Holmes
(74) *Attorney, Agent, or Firm* — Fay Sharpe LLP

(57) ABSTRACT

A modeled-based reasoning system and method including dynamic domain abstraction, includes the use of an abstraction determining module configured to identify an appropriate abstraction level for a system model of a real-world system to be analyzed, from a plurality of potential abstraction levels. A system reasoning module is configured to perform analysis on the system model of the real-world system at the abstraction level determined to be appropriate by the abstraction determining module.

21 Claims, 10 Drawing Sheets

OTHER PUBLICATIONS

*Wikipedia*, Ring oscillator—Wikipedia, the free encyclopedia, 2007. [Online accessed Jun. 17, 2008].

PCT/US 07/85522, International Search Report, mailed Jun. 18, 2008; Authorized Officer, Lee W. Young.

* cited by examiner

140 →

| t | 0 | 1 | 2 | 3 | 4 | 5 | 6 |
|---|---|---|---|---|---|---|---|
| A | 1 | 1 | 1 | 0 | 0 | 0 | 1 |
| B | 1 | 0 | 0 | 0 | 1 | 1 | 1 |
| C | 0 | 0 | 1 | 1 | 1 | 0 | 0 |

150 →

DYNAMIC DOMAIN ABSTRACTION THROUGH META-ANALYSIS

This application claims priority to U.S. Provisional Application No. 60/931,535, filed May 24, 2007, entitled "Dynamic Domain Abstraction Through Meta-Analysis"; and U.S. Provisional Application No. 60/931,526, filed May 24, 2007, entitled "Troubleshooting Temporal Behavior in 'Combinational' Circuits" by Johan de Kleer, the disclosures of which are hereby incorporated by reference in their entireties.

BACKGROUND

The present application is directed to analysis and more particularly to model-based reasoning which employ dynamic domain abstraction. Of the many tools designers have at their disposal, abstraction is one of the most powerful. By abstracting from the detailed properties of a system, the complexity of the overall design task becomes manageable. For example, a computer engineer can focus on the logic level without concern for the properties of the individual transistors which make up a particular gate, and a chip designer can layout a chip without being concerned with the fabrication steps needed to construct it. Abstraction allow designers to partition concerns into independent black boxes, and is one of the most important ideas underlying the design of modern technology. An example of abstraction is illustrated in FIG. 1, which shows three different models of a NAND-gate, beginning with the traditional mosfet transistor level model at the bottom 10.

Then, assuming power can be ignored, and abstracting away from the specific subcomponents to the roles they play, an intermediate level representation 12 of the NAND-gate is developed. Employing two further simplifying assumptions—that current can be ignored and that all the subcomponents can be encompassed by a single box—yields the traditional NAND-gate symbolic representation 14. Thus, the noted assumptions yield two successively simpler models of the device.

Unfortunately, faults in a system need not obey the neat abstraction levels of the designer. For example, a fault in a few transistors can cause IC Pentium processor to generate an occasional incorrect floating point result. To understand this fault requires transcending the many abstraction levels between software and hardware. A PC designer can focus on functional layout without being concerned about the physical layout and its thermal properties. However, a technician must determine the processor crashed because dust sucked into the processor fan clogged the heatsink, and allowed the processor temperature to rise to such a dangerous level the PC automatically shut down. As a consequence diagnostic reasoning is inherently messy and complex, as it involves crossing abstraction boundaries rarely contemplated by the designers.

Model-based reasoning has addressed a number of types of abstraction, including range abstraction, where the ranges of variables are abstracted, e.g., instead of a continuous quantity variables are represented by the qualitative values of −, 0 or +. Another known abstraction type is structural abstraction, where groups of components are abstracted to form hierarchies, and a third abstraction type is called model selection, which teaches approaches to choose among a collection of hand-constructed models.

The above described abstraction techniques do not however discuss ways to dynamically alter an abstraction level or layer, in for example, a diagnostic system performing diagnostic operations.

INCORPORATION BY REFERENCE

U.S. Application Ser. No. 60/931,526 filed May 24, 2007, entitled "TROUBLESHOOTING TEMPORAL BEHAVIOR IN 'COMBINATIONAL' CIRCUITS", by Johan de Kleer; and U.S. Application Ser. No. 60/931,524 filed May 24, 2007, entitled "DIAGNOSING INTERMITTENT FAULTS", by Johan de Kleer.

BRIEF DESCRIPTION

A model-based reasoning system and method including dynamic domain abstraction, uses an abstraction determining module configured to identify an appropriate abstraction level for a system model of a real-world system to be analyzed, from a plurality of potential abstraction levels. A system reasoning module is configured to perform analysis on the system model of the real-world system at the abstraction level determined to be appropriate by the abstraction determining module.

DETAILED DESCRIPTION

By abstracting from detailed properties of a system, complexity of an overall design task becomes manageable. Unfortunately, faults in a system need not obey the neat abstraction levels of the designer. The following presents an approach for identifying an abstraction level which is as simple as possible yet sufficient to address the task at hand. The approach chooses the desired abstraction level through applying model-based diagnosis at the meta-level, i.e., to the abstraction assumptions themselves.

Thus, presented is a new type of abstraction (at times called herein: domain abstraction). This domain abstraction includes the concepts of changing the physical principles which underlie models, such as moving from the 0/1 level to the current/voltage level and providing a systematic approach to choosing the appropriate domain for the diagnostic task.

Choosing the right domain abstraction level requires balancing two opposing desiderata. Reasoning at the highest abstraction level is the simplest. Unfortunately, it may be inadequate to analyze the system. Instead, the system needs to be analyzed at a more detailed level. On the other hand, reasoning at too detailed of a level can require enormously more computational resources and difficult-to-obtain parameters, and it generates more complicated analyses. As Albert Einstein is reported to have said: "Make everything as simple as possible, but not simpler."

Figure 1:
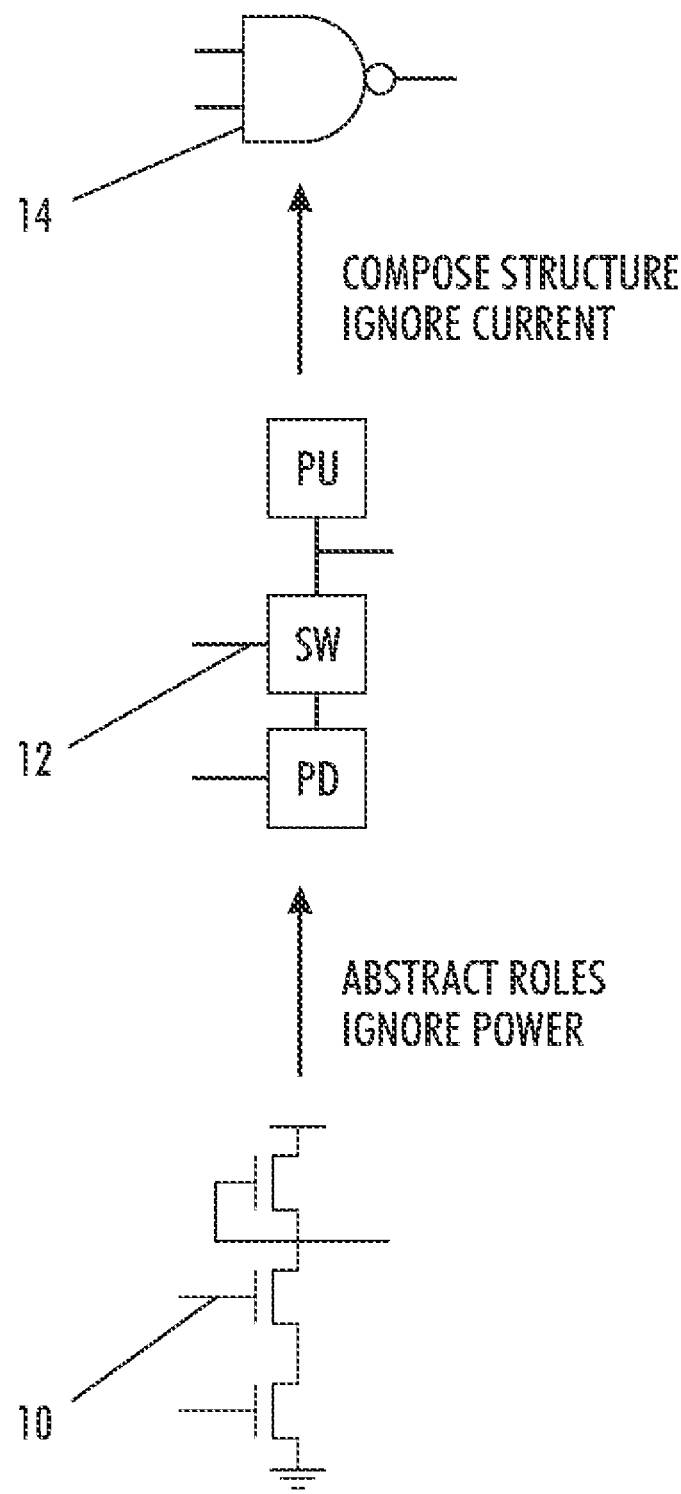
FIG. 1 illustrates the concept of levels or layers of abstraction.
Figure 2:
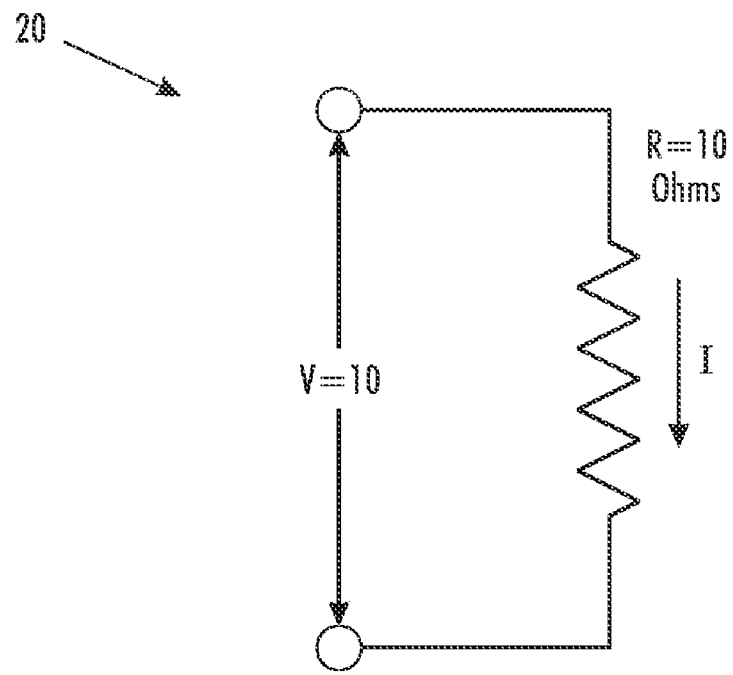
FIG. 2 illustrates an extremely simple analog diagnosis problem to illustrate a basic point.

When troubleshooting a system, technicians expect systems are non-intermittent (e.g., the failures or symptoms are constant) and that the engineering documents (e.g., schematic for circuits) is an accurate description of the physical system. Consider analog circuit 20 of FIG. 2. Suppose a technician measures the current I to be 0 ampere (where 1 is expected). This leads to an inference that resistor R is faulty. Then when repeating the measurement gives 1 ampere (i.e., the expected output). This leads to a conclusion, either the resistor R is intermittent or there is a fault in the connections. To determine the fault, the technician must change abstraction level to diagnose this system further by, for example, checking the connections or further tests on resistor R itself. This example points to the intuitive switching of abstraction levels by the technician, and the benefits which may be obtained.

Figure 3:
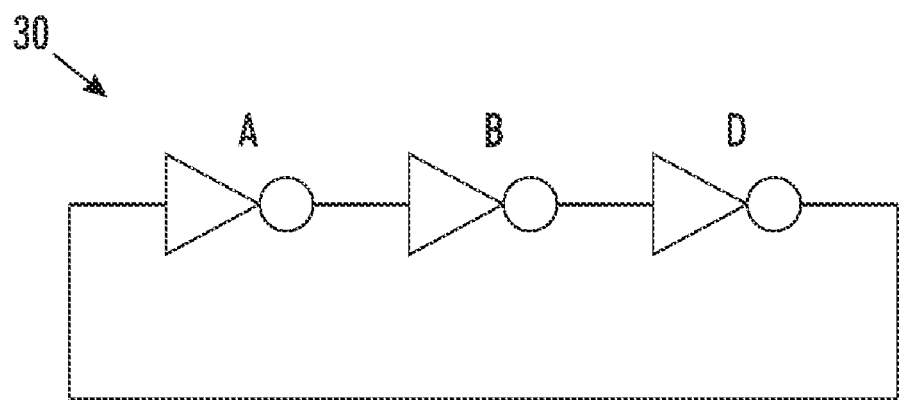
FIG. 3 illustrates a circuit which yields a contradiction when analyzed as combinational logic; yet it's a perfectly reasonable fault-free circuit with well-defined behavior.

Now consider circuit 30 of FIG. 3, having three logic inverters (A,B,D) connected in sequence, with the output from inverter D fedback to the input of inverter A. At the symbolic gate level of analysis, an inverter simply complements its input. Circuit 30 has no external inputs, so it is necessary to consider the possible values at the connecting nodes. Assuming the input to inverter A is 0. Its output must then be 1. The output of B must be 0, and the output of D must be 1. This, however, is impossible, as it was assumed the input to A was 0. Conversely, assuming the input to inverter A is 1, then its output must be 0. The output of B must be 1, and then the output of D must be 0. This is, again however, impossible as it was assumed the input to A was 1. Therefore, the input of inverter A can neither be 0 or 1. Also, the inputs of inverters B or D cannot be 0 or 1. Somehow the circuit is contradictory when modeled as symbolic logic gates. Thus, one of the components A, B or D must be faulted. Suppose, however, the technician chooses to systematically remove and check each of these three components for proper functioning. If each component is confirmed to be correct, the technician has encountered an impasse.

Analyses that result in contradictions are the most important indicator the level of abstraction used is too simplistic. Therefore, presented here is a general reasoner which automatically descends abstraction levels to perform needed analyses, and which does not descend abstraction levels needlessly. The following expands on these concepts in the context of digital circuits with messier models that include failures in connections, intermittents, and temporal behaviors. However, it is to be appreciated the systems and methods disclosed herein may be applied to broader areas, including but not limited to, debugging cognitive models, designing experiments to build improved models of gene pathways, troubleshooting power grids, troubleshooting manufacturing lines, identifying faults in spacecraft, airplanes and automobiles, and debugging programs.

1 Meta-Analysis (or Diagnosis)

Figure 4:
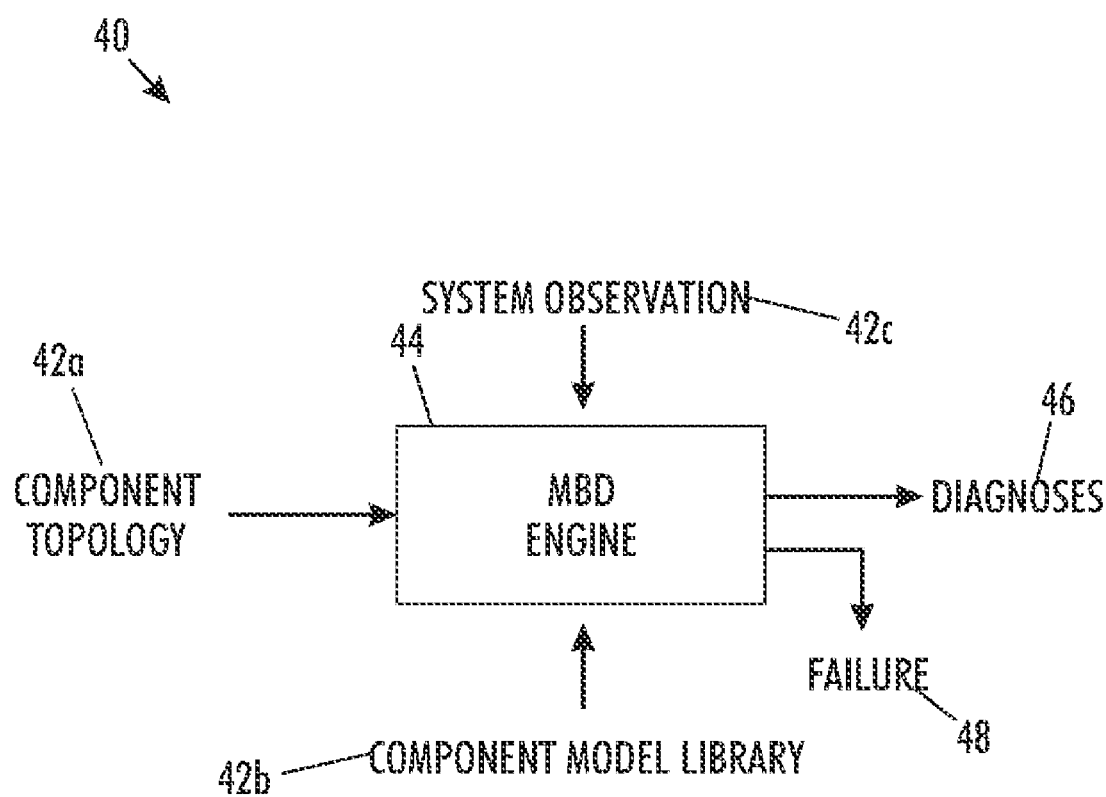
FIG. 4 illustrates the basic architecture of a model-based diagnosis engine.

FIG. 4 characterizes the basic architecture of a model-based, component-based diagnosis (MBD) engine architecture 40. Given the component topology (e.g., the schematic for analog circuits) 42a, component models (e.g., resistors obey ohm's law) 42b and observations (e.g., the voltage across resistor R6 is 4 volts 42c), model-based diagnosis (MBD) engine 44 computes diagnoses 46 which explain all the observations 42c. Observations inconsistent with expectations guide the discovery of diagnoses. When the model-based diagnosis (MBD) engine can find no diagnoses it signals a failure 48.

With continuing attention to FIG. 3, suppose a technician troubleshoots circuit 30. Most diagnosis systems would immediately conclude that some subset of the components {A,B,D} is faulted. However, testing each inverter individually demonstrated that all the components are working appropriately. As a consequence, existing systems or algorithms would report an unresolvable contradiction (i.e., failure).

Figure 5:
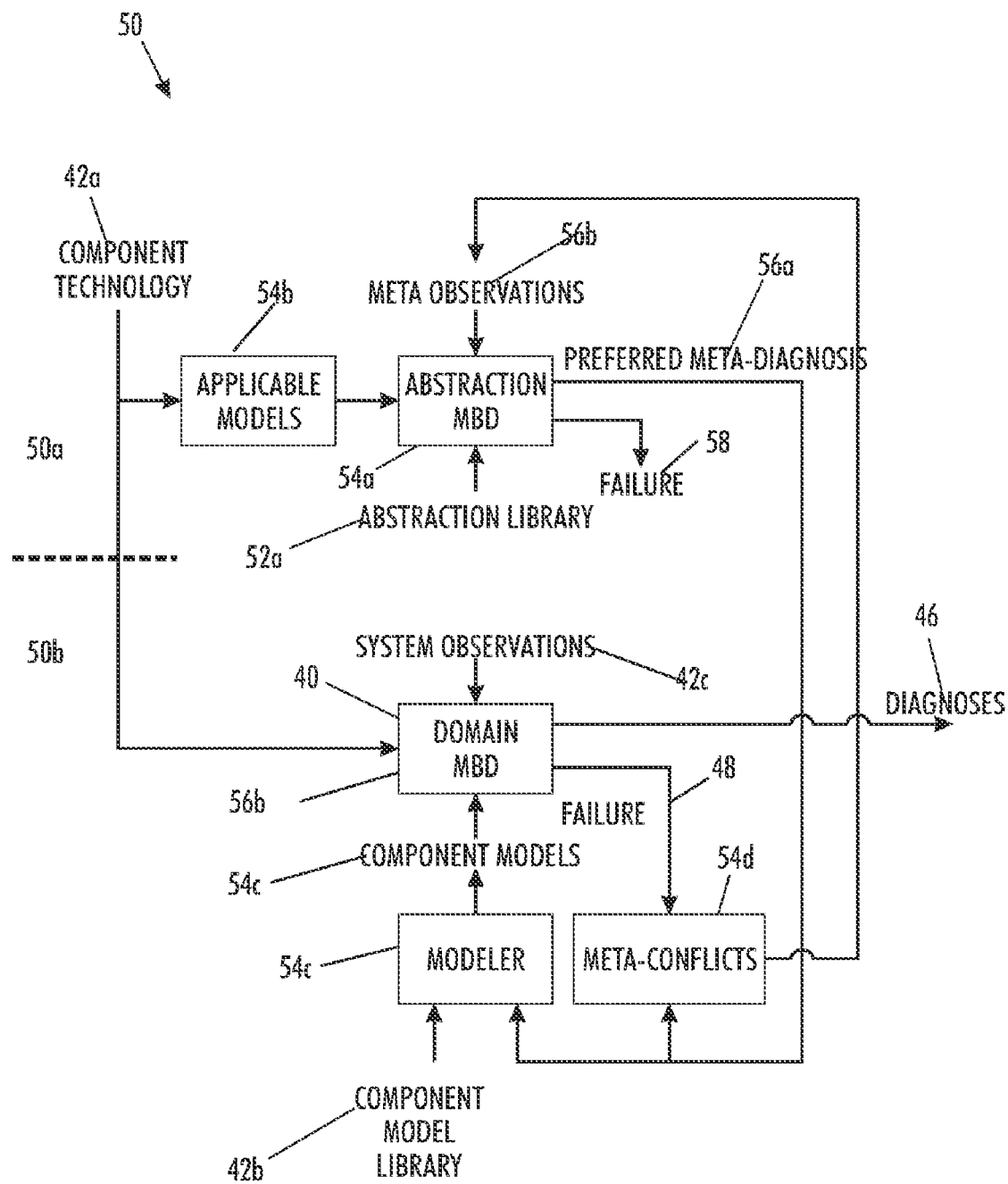
FIG. 5 illustrates the architecture of an abstraction-based model-based diagnosis engine.

However, turning now more particularly to the concepts of the present application, FIG. 5 illustrates an architecture of an embodiment of an MBD engine having dynamic domain abstraction 50, which includes two model-based diagnosis engines. The top model architecture 50a is used to identify an appropriate or best abstraction level, and the bottom model architecture 50b performs actual system diagnosis). This composite architecture has similar external inputs as the basic MBD engine architecture 40 of FIG. 4 with an additional external input abstraction library 52a. Also added is abstraction MBD engine 54a, applicable models module 54b, modeler module 54c, and a meta-conflicts module 54d. These components generate and/or input additional information in the form of "preferred meta-diagnosis" 56a, meta-observations 56b, and component models 56c. The abstraction MBD engine 54a can also output a failure indication 58. The applicable models module 54b identifies all the applicable abstractions from the component topology 42a. The modeler module 54c uses the preferred meta-diagnosis 56a to construct conventional model-based diagnosis component models 56b using the component model library 42b.

Considering now the circuit of FIG. 3 and system architecture 50 of FIG. 5, component topology 42a is simply the circuit schematic 30 as before. System observations 42c are also as before (e.g., the output of inverter A is 1). Component model library 42b contains different models for gate behavior (e.g., boolean, analog, thermal, temporal, etc.). The new input, abstraction library 52a, is the set of all possible abstractions. The abstraction MBD engine 54a, instead of a component topology, is provided with a set of possible abstractions applicable to the given system to be diagnosed. Initially, there are no meta-observations 56b, so the preferred diagnosis 56a is at the most abstract level (analogous to all components working). Therefore, the domain MBD engine 40 will perform diagnosis in the usual way with the most abstract models (i.e., in a manner similar to existing MBD engines, such as in FIG. 4. It is supposed each gate is physically checked, leading to the observations that inverters A, B and D are working correctly. The domain model-based engine 40 will fail (in view of the previous discussion) as it has found an unresolvable contradiction. This invokes the abstraction MBD engine 52a as an observation. More particularly, meta-conflicts module 54d generates meta-observations 56b as an input to abstraction MBD engine 54a. As analysis proceeds, preferred meta-diagnosis 56a will descend abstraction levels, in order to find an abstraction level at which a diagnosis 46 may be obtained.

The desire to find the simplest meta-diagnosis which explains the observations (and no simpler) can be achieved with various criteria. Some example criteria are: most probable, minimal cardinality, and minimal coverage of all possibly invalid abstractions. Unless specified otherwise, we use the minimal cardinality criterion (arbitrarily choosing one if there are more than meta-diagnoses). It is understood, however, the present concepts are also applicable with the other above-mentioned criterion, as well as other criteria not mentioned here.

Figure 6:
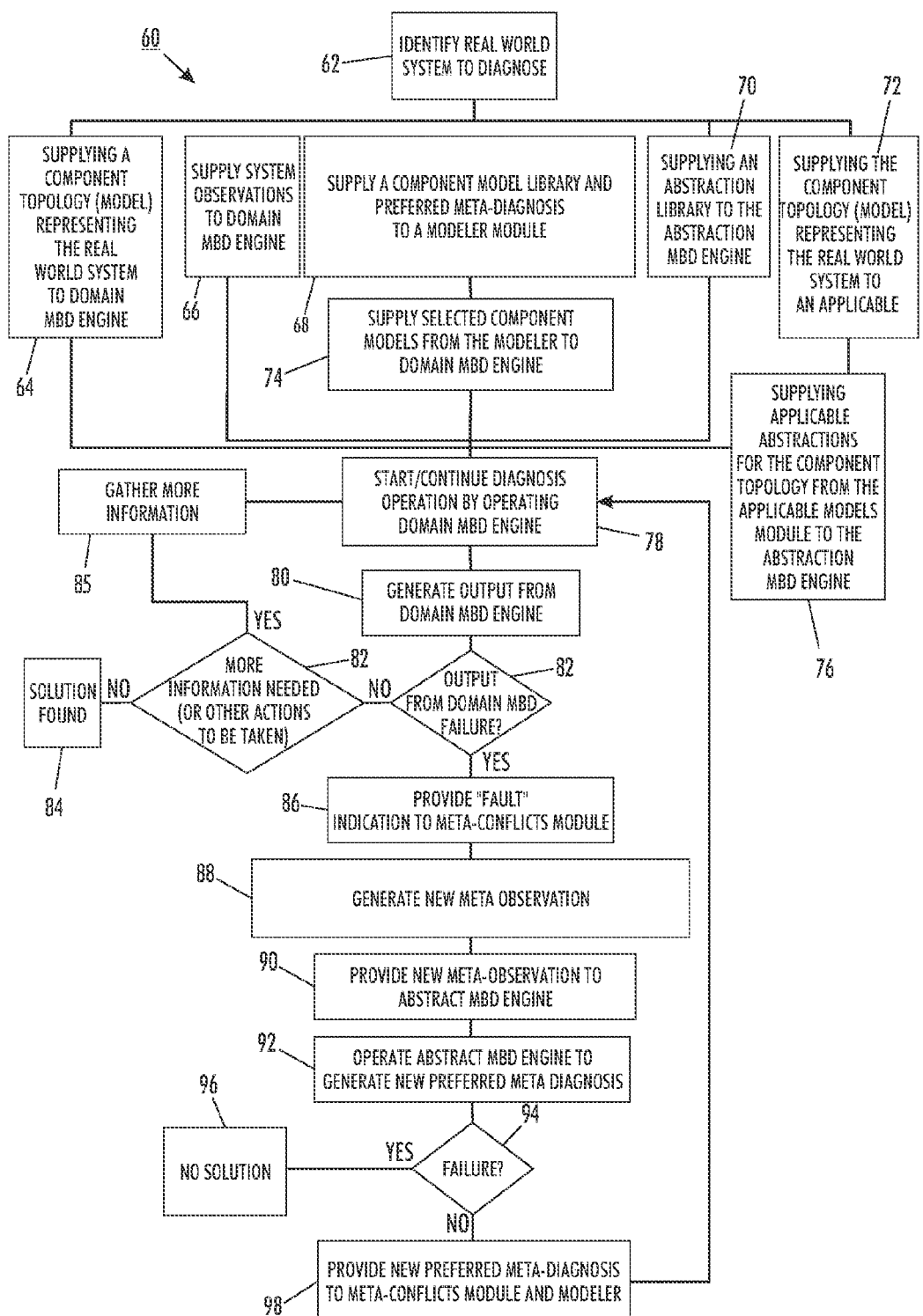
FIG. 6 is a flow diagram for operation of FIG. 5.

Turning to FIG. 6, illustrated is a flow diagram 60 expanding upon the operation of the architecture of FIG. 5.

In step 62, a real-world system is identified to which the diagnostic system and method according to the present application may be applied. Initially, steps 64-72 are shown to be implemented together. This is intended to show that they may be performed in a non-sequential fashion, and in some instances may be thought of as being part of an initialization of the system.

In this regard, the component topology and system observations are provided to the domain MBD engine, steps 64, 66.

In step 68, the component model library is supplied to the modeler module, along with the preferred meta-diagnosis which during initialization will be a default or initial position of providing the most abstract level. In step 70, the abstraction library is provided to the abstraction MBD engine, and in step 72 the component topology is also supplied to applicable models module (it was previously provided to the domain MBD engine in step 64).

In operation, selected component models, step 74, are supplied from the modeler module to the domain MBD engine based on the preferred meta-diagnosis and the component model library. Further, in step 76, appropriate applicable abstractions from the component topology are supplied to the abstraction MBD engine from the applicable models module.

Then in step 78 the operation of domain MBD engine is undertaken, and an output is generated, step 80. A determination is made as to whether or not the output is a failure or solution, step 82. When the answer at step 82 is "no", it is determined that a solution is found and an inquiry is made to see if more information is needed (or other actions should be taken). Particular MBDs can be implemented to exploit number of capabilities, such as identifying repairs, and making additional measurements, among others. In this example the inquiry is directed to obtaining additional information, such as obtaining additional measurements, through probing, step 83. If no additional information is needed the process moves to step 84 where the determined solution may be output. If, however, additional information is needed, such information is gathered, step 85, and it is then supplied to step 78 to allow additional operation of the MBD.

If on the other hand at step 82 the domain MBD could not determine a solution, a failure has occurred, and the process moves to step 86 where the fault indication is provided to the meta-conflicts module. Thereafter, a new meta-observation is generated by the meta-conflicts module using the failure indication, and the preferred meta-diagnostic information within the meta-conflicts module, step 88.

Next, the new meta-observation is provided to the abstract MBD engine, step 90, and the abstract MBD engine is operated to generate a new preferred meta-diagnostic, step 92.

The system is then tested to determine whether such a new preferred meta-diagnosis is obtained in step 94. If one cannot be obtained, then a failure occurs in step 96, and the system stops processing. However, if a failure has not occurred (no, in step 94), the process moves to step 98, where the new preferred meta-diagnosis is sent from the abstract MBD engine to the meta-conflicts module and the modeler module, and more appropriate component models (i.e., of a different abstraction level) are supplied to the domain MBD in step 78.

Again, this process will continue until a diagnosis is found, or a lower level abstraction is obtained for additional investigation. The system will move through levels of abstraction until a solution is found, or until there is a failure from the abstract MBD indicating no solution is obtainable.

The foregoing discussion focuses on the present concepts as they relate to use with diagnostic systems, devices and methods. It is however to be appreciated the concepts described in the foregoing sections, and the remainder of this application, have broader applications. For example, the concepts recited herein may be used to simulate operation of a real-world system prior to that system being designed. In that regard, and with attention to the various elements and processing steps described in FIGS. 4-6, it is to be understood they also have a broader application than only in the diagnostic area.

Therefore, for an example the model-based, component-based diagnostic (MBD) engine architecture 40, is also to be considered to be a model-based, component-based reasoning engine architecture. Similarly, the described model-based diagnosis (MBD) engine 44, which computes diagnoses 46 is also to be considered to be a model-based reasoning engine which computes analysis to explain the observations. With attention to FIGS. 5 and 6, the model architecture 50b which includes the abstraction MBD engine 54a, can also be understood in a broader sense may be defined as an abstraction reasoning engine. Additionally, the information previously identified as the "preferred meta-diagnosis" may also be understood to be the "preferred meta-analysis." Similarly, the modeler module 54c can be understood to use the preferred meta-analysis to construct conventional model-based analysis component models (i.e. instead of the model based diagnosis component models 56b), using the component model library 42b. Finally, unmentioned components may also be understood to be more broadly defined herein as not only for diagnostic operation, but also for the more general concept of reasoning and analysis applicable to other areas outside the diagnostic field.

2 Formalization

This section summarizes the formal framework for model-based diagnosis used in this document. In order to distinguish between domain and abstraction AB literals, the usual framework, which is well known in the art, is stated in terms of domain $AB_d$ literals.

Definition 1 A system is a triple (SD, COMPS, OBS) where:
1. SD, the system description, is a set of first-order sentences.
2. COMPS, the system components, is a finite set of constants.
3. OBS, a set of observations, is a set of first-order sentences.

In FIG. 3 SD is the component topology and component model library, and COMPS is the set of components in the component topology.

Definition 2 Given two sets of components $C_p$ and $C_n$ define $\mathcal{D}_d(C_p, C_n)$ to be the conjunction:

$$\left[\bigwedge_{c \in C_p} AB_d(c)\right] \wedge \left[\bigwedge_{c \in C_n} \neg AB_d(c)\right].$$

Where $AB_d(x)$ represents that the component x is ABnormal (faulted).

A diagnosis is a sentence describing one possible state of the system, where this state is an assignment of the status normal or abnormal to each system component.

Definition 3 Let $\Delta \subset $ COMPS. A diagnosis for (SD, COMPS, OBS) is $\mathcal{D}_d(\Delta, \overline{\text{COMPS}-\Delta})$ such that the following is satisfiable:

$$SD \cup OBS \cup \{\mathcal{D}_c(\Delta, \text{COMPS}-\Delta)\}$$

Definition 4 An $AB_d$-literal is $AB_d(c)$ or $\neg AB_d(c)$ for some $c \in$ COMPS.

Definition 5 An $AB_d$-clause is a disjunction of $AB_d$-literals containing no complementary pair of $AB_d$-literals.

Definition 6 A conflict of (SD, COMPS, OBS) is an $AB_d$-clause entailed by SD $\cup$ OBS.

2.1 Formalizing Abstraction

The abstraction MBD is defined analogously:

Definition 7 An abstraction system is a triple (SD, ABS, OBS) where:
1. SD, constraints among possible abstractions, is a set of first-order sentences.
2. ABS, the applicable abstractions, is a finite set of constants.
3. OBS, a set of meta-observations, is a set of first-order sentences.

Definition 8 Given two sets of abstractions $C_p$ and $C_n$ define $\mathcal{D}_a(C_p, C_n)$ to be the conjunction:

$$\left[\bigwedge_{c \in C_p} AB_a(c)\right] \wedge \left[\bigwedge_{c \in C_n} \neg AB_a(c)\right].$$

Where $AB_a(x)$ represents that the abstraction x is ABnormal (cannot be used).

A meta-diagnosis is a sentence describing one possible state of the system, where this state is an assignment of the status normal or abnormal to each system component.

Definition 9 Let $\Delta \subset$ ABS. A meta-diagnosis for (SD, ABS, OBS) is $\mathcal{D}_a(\Delta, \text{ABS}-\overline{\Delta})$ such that the following is satisfiable:

$$SD \cup OBS \cup \{\mathcal{D}_a(\Delta, \text{ABS}-\Delta)\}$$

Definition 10 An $AB_a$-literal is $AB_a(c)$ or $\neg AB_a(c)$ for some $c \in$ ABS.

Definition 11 An $AB_a$-clause is a disjunction of $AB_a$-literals containing no complementary pair of $AB_a$-literals.

Definition 12 A meta-conflict of (SD, ABS, OBS) is an $AB_a$-clause entailed by SD $\cup$ OBS.

3 Example of a Lattice of Models

To illustrate these ideas three axes of abstraction are used:
Model of connections.
Model of non-intermittency.
Model of time.
The corresponding $AB_a$ literals are:
$\neg AB_a(C)$ represents the abstraction that connections need not be modeled.
$\neg AB_a(I)$ represents the abstraction that the system is non-intermittent.
$\neg AB_a(T)$ represents the abstraction that temporal behavior need not be modeled.

Figure 7:
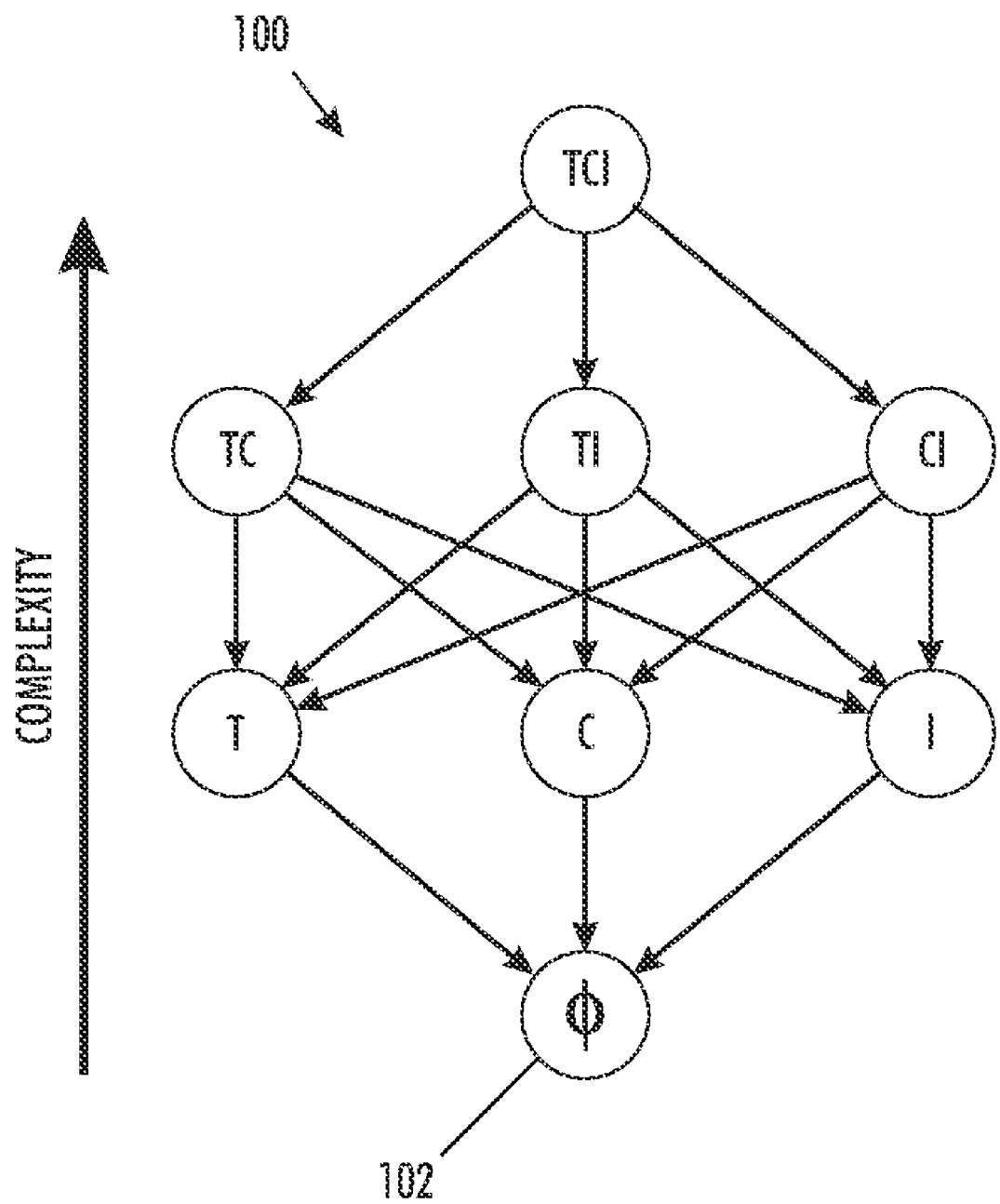
FIG. 7 illustrates a meta-diagnosis lattice for digital gates, where T indicates temporal models, C indicates connection models, and I indicates intermittent models.

FIG. 7 shows a portion of the abstraction space for digital circuits along three of the axes of abstraction in the form of lattice 100. This lattice is identical in structure to the ones used in conventional model-based diagnosis for system diagnoses. In conventional model-based diagnosis, each node represents a candidate diagnosis which explains the observations. Each node in FIG. 7 represents a candidate meta-diagnosis, where T indicates temporal models, C indicates connection models, and I indicates intermittent models. The bottom node 102 in the figure represents the meta-diagnosis in which connections, time and intermittency are not relevant:

$$\neg AB_a(T) \wedge \neg AB_a(C) \wedge \neg AB_a(I).$$

For brevity sake, meta-diagnoses are named with the letters corresponding the abstractions which are $AB_a$. For example, the meta-diagnosis $\neg AB_a(T) \wedge \neg AB_a(C) \wedge AB_a(I)$ is named by I.

Turning to FIG. 3, analysis will immediately detect a contradiction and meta-conflict:

$$AB_a(T) \vee AB_a(C)$$

Figure 8:
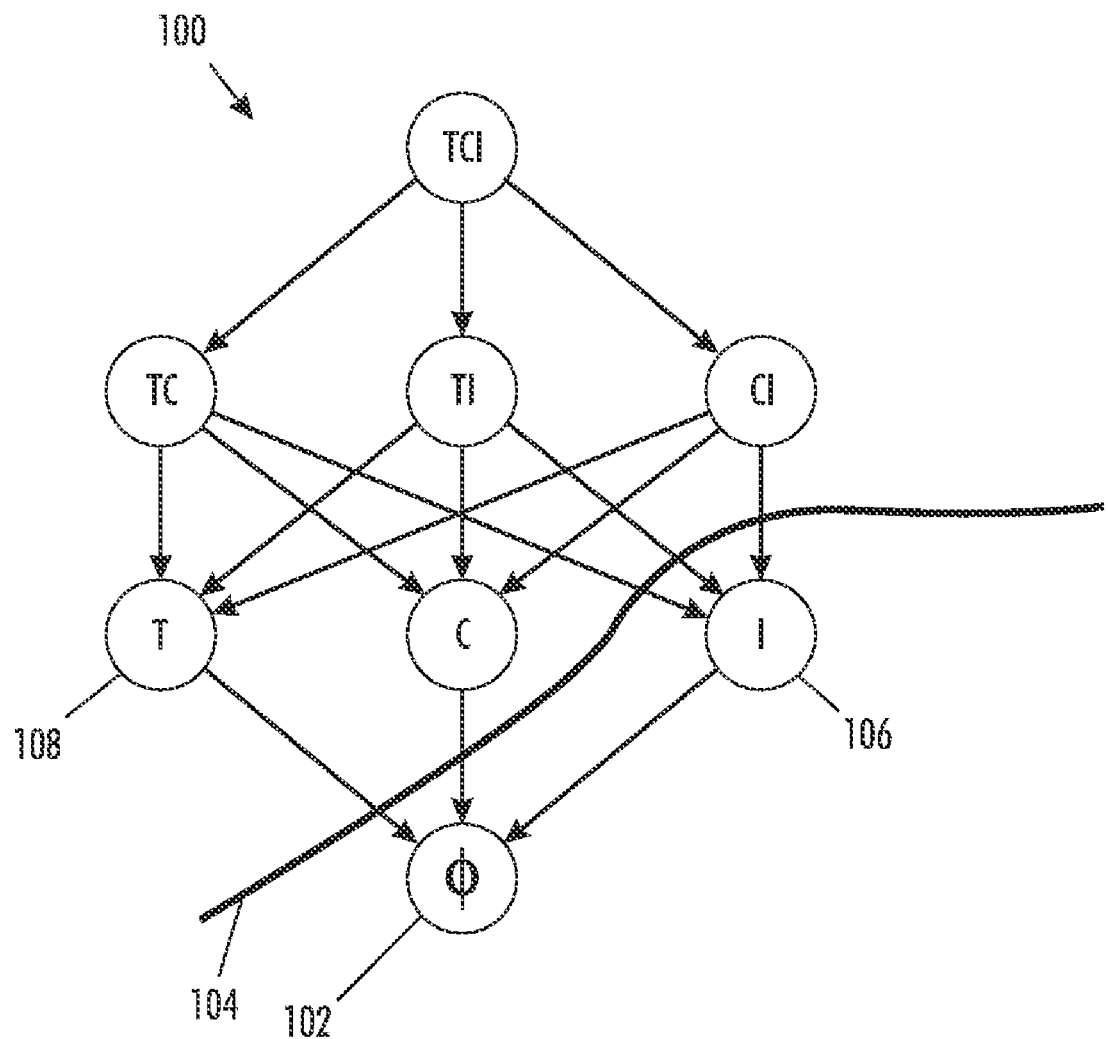
FIG. 8 illustrates a meta-diagnosis lattice for digital gates, where a meta-conflict $AB_a(T) \vee AB_a(C)$ rules out all meta-diagnoses below the curved line, and the minimal meta-diagnoses are T and C.

This contradiction cannot depend on $AB_a(I)$ as there is only one observation time so far. FIG. 8 illustrates the resulting meta-diagnosis lattice, which identifies the meta-conflict. Particularly, every meta-diagnosis below curve 104 (i.e., nodes 102 and 106) is eliminated. Thus, the minimal meta-diagnoses are T, 108 and C, 110.

4 Modeling Components

The conventional MBD model for an inverter is (using the usual background axioms define the appropriate functions, domains and ranges):

$$INVERTER(x) \rightarrow$$
$$[\neg AB_d(x) \rightarrow [in(x,t) = 0 \equiv out(x,t) = 1]].$$

As this model presumes connections and temporal behavior need not be modeled, in the new framework it is written as:

$$\neg AB_a(T) \wedge \neg AB_a(C) \rightarrow$$
$$[INVERTER(x) \rightarrow$$
$$\neg [AB_d(x) \rightarrow [in(x,t)=0 \equiv out(x,t)=1]]]$$

When modeling an inverter as having a delay $\Delta$, the model changes to (labeled T in FIGS. 7 and 8):

$$AB_a(T) \wedge \neg AB_a(C) \rightarrow$$
$$[INVERTER(x) \rightarrow$$
$$[\neg AB_d(x) \rightarrow [in(x,t)=0 \equiv out(x,t+\Delta)=1]]]$$

4.1 Connection Models

To model the inverter to accommodate faults in connections, including bridge faults, requires the introduction of new formalisms. What follows is a brief summary of formalism useful in connection with the present concepts. Each terminal of a component is modeled with two variables, one which models how the component is attempting to influence its output (roughly analogous to current), and the other which characterizes the result (roughly analogous to voltage). There are five, mutually inconsistent, qualitative values for the influence of a component on a node (these are referred to these as "drivers" (i.e., "d")), d($-\infty$) indicates a direct short to ground.
d(0) pull towards ground (i.e., 0).
d(R) presents a high (i.e., draws little current) passive resistive load.
d(1) pull towards power (i.e., 1).
d($+\infty$) indicates a direct short to power.

There are three possible qualitative values for the resulting signal (i.e., "s"):
s(0) the result is close enough to ground to be sensed as a digital 0.
s(x) the result is neither a 0 or 1.

s(1) the result is close enough to power to be sensed as a digital 1.

Using this formalism produces considerably more detailed component models. The A≡B in the inverter model may now be expanded to (A→B) ∧ (B→A). The left half of the inverter model is:

$$\neg AB_a(T) \wedge AB_a(C) \rightarrow$$
$$[INVERTER(x) \rightarrow$$
$$[\neg AB_d(x) \rightarrow$$
$$[[s(in(x,t)) = s(0) \rightarrow d(out(x,t)) = d(1)]$$
$$\wedge [s(in(x,t)) = s(1) \rightarrow d(out(x,t)) = d(0)]$$
$$\wedge d(in(x,t)) = d(R)$$
$$\wedge [d(out(x,t)) = d(0) \vee d(out(x,t)) = d(1)]]]].$$

Explicit models are needed to describe how the digital signal at a node is determined from its drivers. Let R(v) be resulting signal at node v and S(v) be the collection of drivers of node v. Intuitively, the model for a node is:

If d(−∞) ∈ S(v), then R(v)=s(0).
If d(+∞) ∈ S(v), then R(v)=s(1).
If d(0) ∈ S(v), then R(v)=s(0).
Else, if all drivers are known, and the preceding three rules do not apply, then R(v)=s(1).

The resulting model for the node x will depend on $\neg AB_d(x)$ and $AB_a(C)$.

Modeling the inverter to more accurately describe both temporal and causal behavior (labeled TC in FIG. 7):

$$AB_a(T) \wedge AB_a(C) \rightarrow$$
$$INVERTER(x) \rightarrow$$
$$[\neg AB_d(x) \rightarrow$$
$$[[s(in(x,t)) = s(0) \rightarrow d(out(x,t + \Delta)) = d(1)$$
$$\wedge [s(in(x,t)) = s(1) \rightarrow d(out(x,t + \Delta)) = d(0)]$$
$$\wedge d(in(x,t)) = d(R)$$
$$\wedge [d(out(x,t + \Delta)) = d(0) \vee d(out(x,t + \Delta)) = d(1)]]]].$$

The connection models also allow arbitrary bridge faults among circuit nodes. These are not described here, but are described in U.S. patent application Ser. No. 11/775,650, filed Jul. 10, 2007, by Johan de Kleer, entitled, "Modeling When Connections Are The Problem", which is hereby incorporated by reference in its entirety.

4.2 Modeling Non-Intermittency

Figure 9:
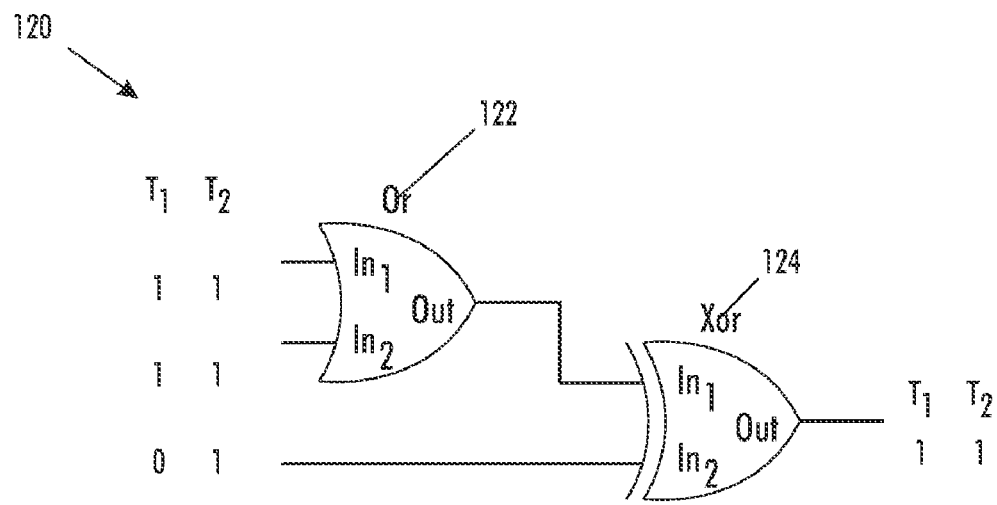
FIG. 9 illustrates a diagnostic situation in which diagnostic precision is greatly improved using non-intermittency.

FIG. 9 shows an example circuit 120, having an Or-gate 122 and an Xor-gate 124 where assuming non-intermittency improves diagnostic discrimination. The circuit's inputs and outputs are marked with values observed at times: $T_1$ and $T_2$. Note that at $T_1$, the circuit outputs a correct value and that at $T_2$ the circuit outputs an incorrect one. By assuming the Or-gate 122 behaves non-intermittently, it can be established that the Xor gate 124 is faulty as follows.

If Xor is good, then $In_1(Xor, T_1)=1$. This follows from $In_2(Xor, T_1)=0$, $Out(Xor, T_1)=1$ and the behavior of Xor. Similarly, if Xor is good, then $In_1(Xor)=0$ at $T_2$. However, if Or behaves non-intermittently, then $In_1(Xor, T_2)=1$. This follows because Or has the same inputs at both $T_1$ and $T_2$ and must produce the same output. Thus there are two contradictory predictions for the value of $In_1(Xor, T_2)$. Either Xor is faulty or Or is behaving intermittently. Assuming non-intermittency means Xor is faulty.

All the inferences follow from the defining of non-intermittency:

Definition 13 A component behaves non-intermittently if its outputs are a function of its inputs.

This definition sanctions the following inference: if an input vector $\overline{X}$ is applied to an intermittent component at time T, and output Z is observed, then in any other observation T', if $\overline{X}$ is supplied as input, Z will be observed as output.

For the Or-Xor example, the axioms added are:

$$\forall t. Out(Or,t)=F(Or,In_1(Or,t),In_2(Or,t)) \quad (1)$$

$$\forall t. Out(Xor,t)=F(Xor,In_1(Xor,t),In_2(Xor,t)) \quad (2)$$

where F is a single fixed function for all non-intermittency axioms.

These axioms are implemented in the ATMS/HTMS-based reasoner by deriving prime implicates as follows. At time $T_1$:

$$AB_d(Xor) \vee [F(Or,1,1)=1].$$

At time $T_2$:

$$AB_d(Xor) \vee [F(Or,1,1)=0].$$

Which combine to yield $AB_d(Xor)$.

In the intermittent case, the observation at $T_1$ equally weights Xor and Or as being correct. If there were other components in the system not affected by the measurement, the observation at $T_1$ lowers the posterior fault probabilities of Xor and Or.

4.3 Automatic Generation of Models

The more detailed component models can usually be generated automatically from the most abstract models in a systematic way. In the present implementation, the T, C and I models are automatically derived from the basic Ø models by a set of modeling schemas. Consider the most abstract model of an inverter:

$$INVERTER(x) \rightarrow$$
$$[\neg AB_d(x) \rightarrow [in(x,t) = 0 \equiv out(x,t) = 1]].$$

In the following convention used is the function "in" to refer to inputs, and the function "out" refers to outputs. A non-temporal model can be converted to a simple gate-delay model by replacing every occurrence of out(x, t) (or $out_j(x, t)$) with out(x, t+Δ).

A non-connection model can be converted to a connection one by first expanding implications, replacing all in(x, t)=y with s(in(x, t))=s(y) and d(in(x, t))=d(R) and replacing all out(x, t)=y with d(out(x, t))=d(y), and adding the usual domain axioms for new variable values.

Non-intermittency requires no change to the component models themselves, but the axioms of Section 4.2 need to be added to the models supplied to the domain MBD.

5 The Meta-Diagnosis Loop 5.1 Ø→T

Returning attention to the three inverter circuit 30 example of FIG. 3. The most abstract meta-diagnosis is:

$$\neg AB_a(T) \wedge \neg AB_a(C) \wedge \neg AB_a(I).$$

This meta-diagnosis is supplied to the modeler module 54c of FIG. 5 which chooses the component models at the meta-diagnosis level. The modeling operations to model all three inverters are described in Section 4. This produces a failure because all components are known to be good. The meta-conflicts module 54d of FIG. 5 then constructs the meta-conflict:

$$AB_a(T) \vee AB_a(C).$$

$AB_a(I)$ is trivially excluded from the meta-conflict because non-intermittency inferences can only arise when the system has been observed at multiple times.

Figure 10:
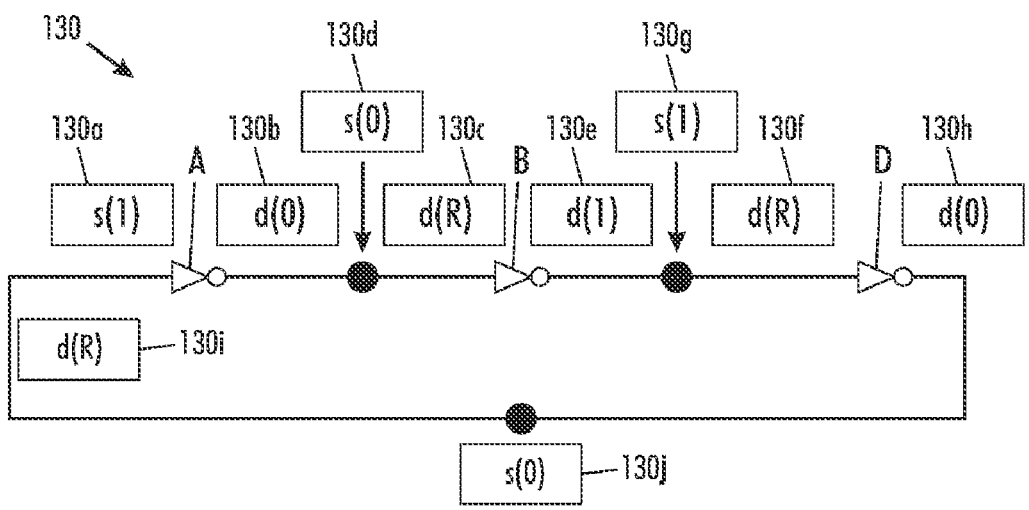
FIG. 10 presents an analysis of a diagnostic situation in which modeling connections does not remove the failure.

The abstraction MBD engine identifies two minimal meta-diagnoses T and C. If both are equally likely, it arbitrarily picks one. Supposing C is chosen, the C models do not resolve the inconsistency either. FIG. 10 illustrates the following sequence of inferences 130 with the connection models for the circuit of FIG. 3: (130a) Assume the input of A is 1, (130b) the causal inverter model drives its output down towards 0, (130c) the input of gate B presents a high resistance (low-current) load to its node, (130d) the connection model sets the node to 0, (130e) the inverter model on B drives its output towards 1, (130f) gate D presents a high resistance (low current) load, (130g) the connection model sets its node to 1, (130h) the inverter drives its output to 0, (130i) gate A presents a high resistance (low current) load, (130j) the node model sets the node to 0, which contradicts the input of A being 1. An analogous analysis for the input of A being 0, yields a contradiction as well. The only remaining possible cardinality one diagnosis is T.

Figures 11, 12:
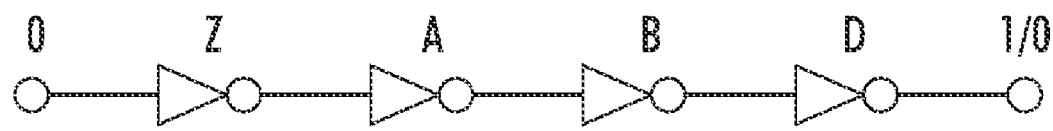
FIG. 11 is a Table illustrating outputs of an inverter of a ring oscillator after "t" gate delays.
FIG. 12 is a circuit containing a very hard-to-pinpoint fault.

Using the temporal T models for the inverters produces a consistent analysis illustrated in the Table 140 of FIG. 11, which is for the familiar ring oscillator.

Table of FIG. 11 shows the outputs of the inverters of the ring oscillator after t gate delays. The oscillator takes six gate delays to return to its initial state, thus the output is a square wave with a period of six times the gate delay.

5.2 $\emptyset \rightarrow I$

Consider the Or–Xor circuit 120 again of FIG. 9. For clarity assume the circuit has one fault. As derived in the Section 4.2, under the $\emptyset$ models, Xor must be faulted. Suppose the output of the Or gate is measured at $T_1$ and $T_2$ to be 1 and then 0 respectively. In this case, we have derived the meta-conflict:

$$AB_a(T) \vee AB_a(C) \vee AB_a(I).$$

There are now three minimal candidate meta-diagnoses: T, C, I. The T meta-diagnosis immediately results in a failure yielding the meta-conflict:

$$AB_a(C) \vee AB_a(I).$$

The meta-diagnosis I yields a consistent point of view: Or is failing intermittently. The C meta-diagnosis cannot explain the observation:

$$AB_a(T) \vee AB_a(I).$$

5.3 $\emptyset \rightarrow C$

Consider the Or–Xor example again before the output of the Or gate is observed. Again, for clarity assume the circuit has one fault. Suppose Xor is replaced and the same symptoms reoccur. In this case, both the C and I meta-diagnoses are consistent. Under the I meta-diagnosis, the circuit contains two possible faults:

Xor is faulted.
Or is faulted.

The C meta-diagnosis is consistent, with three possible faults:

The node at the output of Xor is shorted to power.
The connection from the output Xor gate to the node is open and thus it floats to 1.
The connection to $in_2$(Xor) is shorted to ground.

5.4 $\emptyset \rightarrow TCI$

Tasks which require a TCI preferred meta-diagnosis are complicated, but they do occur. Consider the four inverter system 150 of FIG. 12. The input to inverter Z is held constant at 0, and single faults are assumed. Observing the output D is usually 0, but outputs 1s with no pattern. The observation D=1 indicates that one of Z, A, B, D is faulted. However, a subsequent observation of D=0 is inconsistent yielding the meta-conflict:

$$AB_a(T) \vee AB_a(C) \vee AB_a(I).$$

No fault in the connections can produce the observations, therefore:

$$AB_a(T) \vee AB_a(I).$$

No temporal fault can lead to this behavior either, so:

$$AB_a(I).$$

Under meta-diagnosis I, the output of A is measured—it is usually 0, but sometimes 1. The output of Z is measured—it is usually 1, but sometimes 0. Therefore Z must be intermittently faulted (under meta-diagnosis I), but replacing it does not change the symptoms. This yields the meta-conflict:

$$AB_a(T) \vee AB_a(C).$$

The CI meta-diagnosis also leads to an inconsistency. There is no fault within the connections that can explain the observations. Likewise there is no fault within the TI meta-diagnosis. The only meta-diagnosis that can explain the symptoms is TCI. The actual fault is an intermittent short between the output of D and output of Z. As the input to Z is 0, its output is 1. The connection models for digital gates are 0-dominant, so that, if a 0 from the output of D were fedback through an intermittent short, it would drive the input to A to 0. Thus for those times in which the intermittent short was manifest, the circuit would be a ring oscillator.

6 Implementation

An Assumption-based Truth Maintenance System (ATMS) and Hybrid-Truth Maintenance System (HTMS) arrangement involves a propositional inference engine designed to simplify the construction of problem solvers that search complex search spaces efficiently. The ATMS/HTMS represents problem states with assumptions, which correspond to primary binary choices, and nodes, which correspond to propositions whose truth is dependent on the truth of the assumptions. Dependency relationships among assumptions and nodes are determined by a domain-specific problem solver such as a conventional inference engine. The problem solver presents these relationships to the ATMS/HTMS as justifications. The ATMS/HTMS determines which combinations of assumptions are consistent and identifies the conclusions to which they lead.

The ATMS/HTMS is conventionally implemented by extending a conventional inference engine appropriate to the problem being solved. The extension includes a propositional reasoner and an interface that receives calls from the inference engine, passes them to the propositional reasoner, and returns results to the inference engine.

The analyses described in this discussion have been implemented within the ATMS/HTMS framework. Each domain or abstraction literal is represented by an explicit ATMS assumption in one ATMS instance. The ATMS/HTMS architecture provides a unified framework to reason over any assumptions, be they about components or abstractions.

7 Related Work and Designs

Automated model abstraction has a long tradition in Artificial Intelligence. The graph of models is similar to the meta-diagnosis lattice (FIGS. 7, 8) and analyzes conflicts to identify which modeling parameters to change. It is focused on design and analysis and the models that are constructed by hand. It does not use diagnosis to guide the search for models, nor is it applied to diagnosis in some domain. Work on compositional modeling also uses ATMS assumptions to represent domain abstractions and conflicts to guide the search for models. Again, the models are constructed by hand and do not use diagnosis at the domain or meta-levels. In context-dependent modeling there is typically a much larger space of model fragments to choose from and explicit context information is used to guide the selection of the domain models. The task is to construct the best causal explanation for a physical phenomena. Again, the models are constructed by hand and do not use diagnosis at the domain or meta-levels.

In the model-based diagnosis literature, there has been considerable work on diagnostic assumptions and selecting appropriate models for a diagnostic task. This application focuses primarily on assumptions associated with choosing domain abstractions automatically.

There has also been considerable research on structural abstraction where groups of components are combined to form larger systems to reduce computational complexity. Others have described how the task can be used to partition the value of a variable into the qualitative values needed to solve a task. Another approach is to partition the value of a variable into qualitative ranges to reduce complexity when there are limited observability of the variables.

Figure 13:
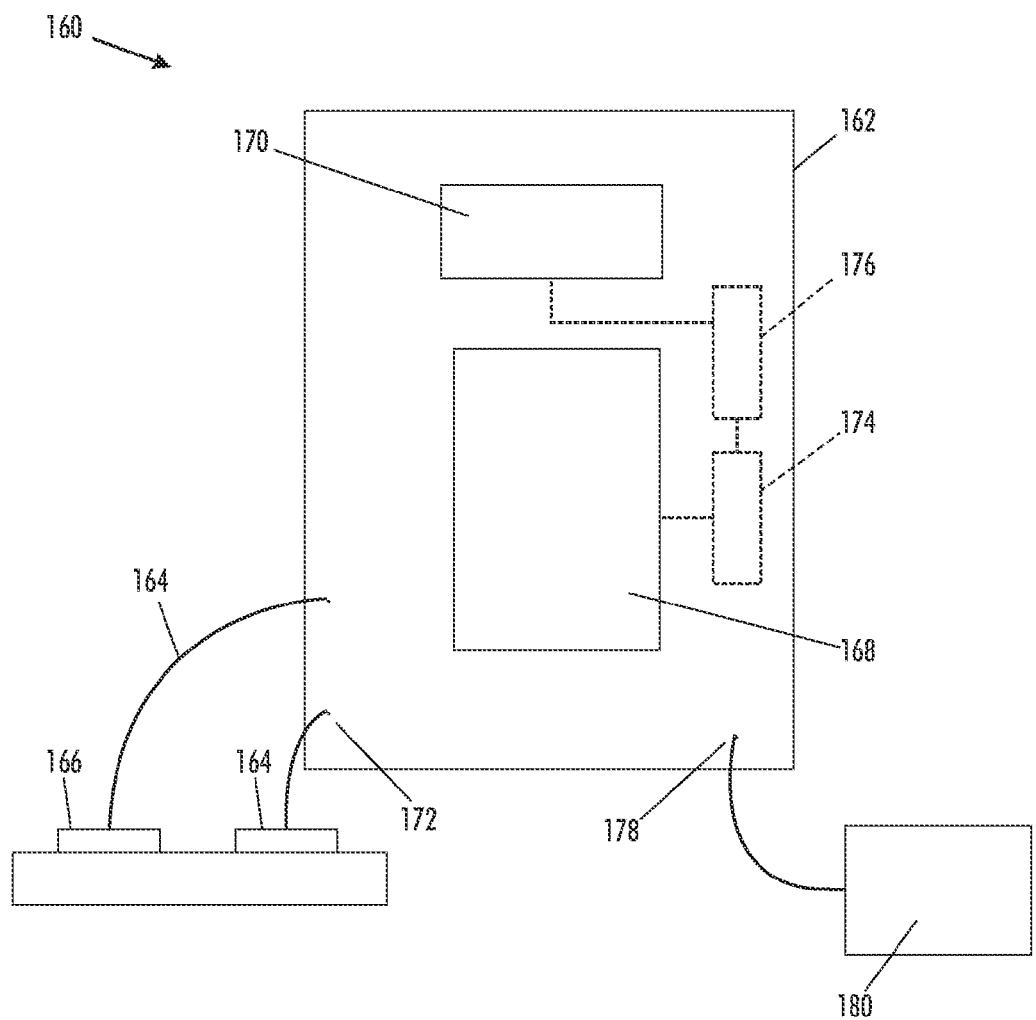
FIG. 13 is directed to an embodiment of a diagnostic device incorporating the concepts of the present application.

The preceding discussion focused on providing an improved system and method of diagnosing faults of a system under test. As previously mentioned, such diagnostic testing can be implemented in a wide range of areas. For example, as shown in FIG. 13, concepts disclosed in the present application may be embodied in a diagnostic device or system 160, including a body 162 and probes 164. Probes 164 are designed to be positioned in operative association with a device under test 166. Body 160 may include an input 168 and an output 170. The input 168 can include an alphanumeric keypad, stylus, voice, or other input design or interface known to input data or instructions. Output 170 may be any sort of display to display the results of a diagnostic investigation. Body 162 may also include a secondary set of inputs 172, wherein information detected by probes 164 are automatically input into diagnostic device 160.

It is to be understood that body 162 includes computational capabilities including at least a processor 174 and memory 176, which permits the processing of software code, including code incorporating the concepts described herein. Still further, diagnostic device 160 may include output 178, for connection to an output device 180 to permit the printing of hardcopies of output reports regarding the results of the diagnostic investigation.

It is to be appreciated the above description may be implemented on customized diagnostic devices, and/or may be included as part of hand-held computers, laptops, desktops or other computing devices, including personal digital assistants. Still further, the diagnostic device 160 is intended only as examples of how the concepts of the present application may be implemented.

In another embodiment, FIG. 13 may not include probes 164, but rather the diagnostics may be undertaken on computer software operating on the diagnostic device, or associated with another device having computational capabilities.

Figure 14:
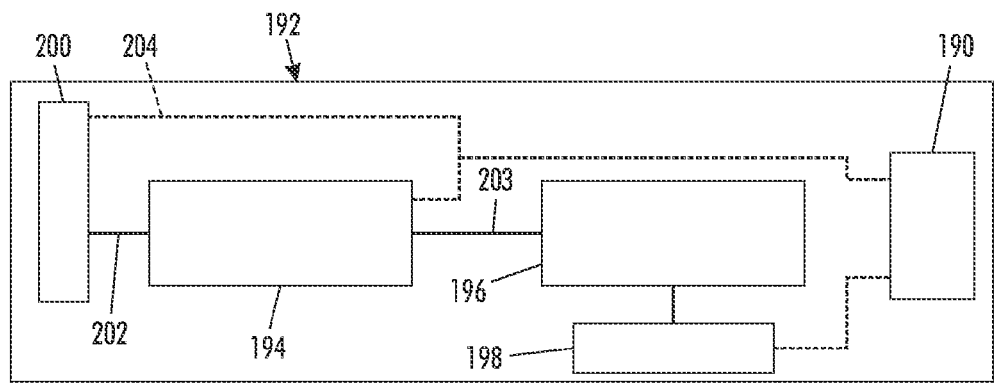
FIG. 14 is directed to another embodiment of a diagnostic device incorporating the concepts of the present application.

In another embodiment illustrated in FIG. 14, the diagnostic device or system 190 is itself embedded as part of a larger overall system 192, which may, for example, include components 194-200 shown in operative connection with each other via solid lines 202. The diagnostic device or system 190, in turn is shown to be in operative connection with the components 194-200 via dotted lines 204. It is to be appreciated FIG. 14 is a high level example of a system in which a diagnostic device or system according to the present application may be used. The purpose of the diagnostic device or system 190 is to identify faults in the overall system 192 and initiate repairs without any human intervention. Examples of such overall systems would be reprographic equipment, automobiles, spacecraft, and airplanes, among others.

8 Conclusions

This discussion has presented a general approach to selecting the best domain abstraction level to address a task and has demonstrated it within the context of digital gates. In the case of digital gates the component models can be automatically generated from the basic models using domain schemas. Also, it has been noted that while the examples of this application have primarily described an implementation directed to diagnostics, these concepts are applicable to other uses including system simulations, among others.

It will be, further, appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A model based reasoning system having dynamic domain abstraction, the model-based reasoning system comprising:
   an abstraction determining module, implemented on a processor device, configured to identify an abstraction level for a system model of a real world system to be analyzed from a plurality of potential abstraction levels; and
   a system reasoning module, implemented on a processor device, configured to perform analysis on the system model of the real world system at the abstraction level determined by the abstraction determining module, wherein the system reasoning module configured to perform analysis is particularly configured to perform at least one of a diagnosis of the real world system or a simulation of the real world system.

2. A model based reasoning system having dynamic domain abstraction, the model-based reasoning system comprising:
   an abstraction determining module, implemented on a processor device, configured to identify an abstraction level for a system model of a real world system to be analyzed from a plurality of potential abstraction levels, wherein the abstraction determining module, is configured to automatically generate the model of the real world system; and
   a system reasoning module, implemented on a processor device, configured to perform analysis on the system model of the real world system at the abstraction level determined by the abstraction determining module.

3. The model-based reasoning system of claim 1 further including:
   an input for receiving a component topology of the system model to be analyzed;
   an input for receiving component models of the system model to be analyzed;
   an input for receiving system observations related to the system model to be analyzed;
   an input for receiving meta-observations related to the system model to be analyzed; and
   an input for receiving abstractions of the system model to be analyzed.

4. The model-based reasoning system of claim 3 further including:
   an output from the abstraction determining module for outputting a preferred meta-diagnosis to the system reasoning module;

an output from the abstraction determining module for outputting a failure indication; and
an output from the system reasoning module for outputting the meta-observations to the abstraction determining module.

5. The model-based reasoning system of claim 1 wherein the abstraction determining module further includes:
an applicable models module, configured to receive the component topology and identify applicable abstractions for the received component topology; and
an abstraction model-based reasoning engine, configured,
to receive as input, (i) output from the applicable models module, (ii) meta-observations, and (iii) abstractions, from an abstractions library, and
to generate as output, (i) a failure signal or (ii) a preferred analysis signal for supply to the system reasoning module.

6. The model-based reasoning system of claim 1 further including the abstraction determining module being configured to supply a most abstract model of the system to be analyzed as an initial or default model, to the system reasoning module.

7. The model-based reasoning system of claim 1 further including a preferred meta-analysis generated by the abstraction determining module for an input to the system reasoning module.

8. The model-based reasoning system of claim 1 wherein the system reasoning module further includes,
a domain model-based reasoning engine configured to receive the component topology of the system to be analyzed;
a modeler module configured to receive the preferred meta-analysis and the component models from the component library, and to output selected ones of the components received from the component library to the domain model-based reasoning engine, based on the received preferred meta-diagnosis; and
a meta-conflicts module configured to,
(i) receive a preferred meta-diagnosis from the abstraction determining module, a failure indication from the domain model-based reasoning engine, and to generate a meta-observation to the abstraction determining module.

9. The model-based reasoning system of claim 1 wherein the abstraction determining module is configured to supply abstractions from more abstract to less abstract.

10. The model-based reasoning system of claim 9, wherein the abstraction determining module is further configured to provide only as detailed a model as needed to obtain an analysis result.

11. A method of performing model-based reasoning using dynamic domain abstraction on a system model, the method comprising:
dynamically identifying, by use of a processor device, an abstraction level for a system model of a real world system to be analyzed, from a plurality of potential abstraction levels of an abstraction determining module; and
performing analysis, by use of the processor device, on the system model of the real world system by a system reasoning module, at the abstraction level determined by the abstraction determining module, wherein the system reasoning module configured to perform analysis is particularly configured to perform at least one of a diagnosis of the real world system or a simulation of the real world system.

12. The method of performing model-based reasoning according to claim 11 wherein the abstraction determining module, is configured to automatically generate the models of the real world system.

13. The method of performing model-based reasoning using dynamic domain abstraction on a system model according to claim 11 further including:
inputting a component topology of the system model to be analyzed;
inputting component models of the system model to be analyzed;
inputting system observations related to the system model to be analyzed;
inputting meta-observations related to the system model to be analyzed; and
inputting for receiving abstractions of the system model to be analyzed.

14. The method of performing model-based analysis using dynamic domain abstraction on a system model according to claim 13 further including:
outputting from the abstraction determining module a preferred meta-diagnosis to the system reasoning module;
outputting from the abstraction determining module a failure indication; and
outputting from the system reasoning module a meta-observation to the abstraction determining module.

15. The method of performing model-based reasoning using dynamic domain abstraction according to claim 11 wherein the abstraction determining module further includes:
receiving, by an applicable models module, the component topology and identifying applicable abstractions for the received component topology; and
configuring an abstraction model-based reasoning engine,
to receive as input, (i) output from the applicable models module, (ii) meta-observations, and (iii) abstractions, from an abstractions library, and
to generate as output, (i) a failure signal or (ii) a preferred analysis signal for supply to the system reasoning module.

16. The method of performing model-based reasoning using dynamic domain abstraction according to claim 11 further including supplying a most abstract model of the system to be analyzed as an initial or default model, to the system reasoning module.

17. The method of performing model-based reasoning using dynamic domain abstraction according to claim 11 further including generating a preferred meta-diagnosis, by the abstraction determining module, for an input to the system reasoning module.

18. The method of performing model-based reasoning using dynamic domain abstraction according to claim 11 wherein the system reasoning module, further includes,
receiving, by the domain model-based reasoning engine, the component topology of the system to be analyzed;
receiving, by a modeler module, the preferred meta-analysis and the component models from the component library, and outputting selected ones of the components received from the component library to the domain model-based reasoning engine, based on the received preferred meta-analysis; and
configuring a meta-conflicts module to,
(i) receive a preferred meta-analysis from the abstraction determining module, a failure indication from the domain model-based reasoning engine, and to generate a meta-observation to the abstraction determining module.

19. The method of performing model-based reasoning using dynamic domain abstraction according to claim 11 wherein the abstraction determining module is configured to supply abstractions from more abstract to less abstract.

20. The method of performing model-based reasoning using dynamic domain abstraction according to claim 19, wherein the abstraction determining module is further configured to provide only as detailed a mode as needed to obtain an analysis result.

21. A computer program product for use with a computing device, the computer product comprising:
 a computer usable medium having computer readable program code embodied therein for,
 dynamically identifying an abstraction level for a system model of a real world system to be analyzed, from a plurality of potential abstraction levels of an abstraction determining module, wherein the system reasoning module performs at least one of a diagnosis of the real world system or a simulation of the real world system; and
 performing analysis on the system model of the real world system by a system reasoning module, at the abstraction level determined by the abstraction determining module.

* * * * *